United States Patent
Xin-Shan (10) Patent No.: US 7,343,654 B2
(45) Date of Patent: Mar. 18, 2008

(54) METHOD OF MANUFACTURING A PIEZOELECTRIC ELEMENT AND A LIQUID INK JET HEAD

(75) Inventor: Li Xin-Shan, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 259 days.

(21) Appl. No.: 11/040,090

(22) Filed: Jan. 24, 2005

(65) Prior Publication Data

US 2005/0236929 A1    Oct. 27, 2005

(30) Foreign Application Priority Data

Jan. 23, 2004 (JP) .............................. 2004-016256
Jan. 11, 2005 (JP) .............................. 2005-004356

(51) Int. Cl.
  *H04R 17/00*    (2006.01)
  *H05K 3/02*    (2006.01)
(52) U.S. Cl. ........................ 29/25.35; 29/846; 347/68; 310/364; 427/100; 427/126.3
(58) Field of Classification Search ................ 29/25.35, 29/846; 347/68, 71; 250/493.1; 310/363, 310/364, 311, 312; 427/100, 126.3, 584; 117/3, 88, 101
See application file for complete search history.

(56) References Cited

U.S. PATENT DOCUMENTS 5,670,206 A * 9/1997 Taoda et al. ......... 427/126.3 X
5,838,016 A * 11/1998 Johnson ................ 250/493.1 X
6,225,650 B1 * 5/2001 Tadatomo et al. ...... 117/101 X
6,336,717 B1 * 1/2002 Shimada et al. ............... 347/71
6,551,652 B2 * 4/2003 Qiu et al. .................... 427/100
2004/0013794 A1 * 1/2004 Hashimoto et al. ......... 427/100

FOREIGN PATENT DOCUMENTS

JP           57-18113   *   1/1982   ................ 29/25.35
JP       2001-274472 A      10/2001

OTHER PUBLICATIONS

NB 82081697, IBM Technical Disclosure Bulletin, "Device Structure and Fabrication Process for a Fundamental Mode Acoustical", Aug. 1982, vol. 25, Issue No. 3B, p. 1697-1700.*

* cited by examiner

*Primary Examiner*—A. Dexter Tugbang
(74) *Attorney, Agent, or Firm*—Sughrue Mion, PLLC (57) ABSTRACT

Provided are a piezoelectric element, a method of manufacturing the same, and a liquid jet head, which can improve, and homogenize, characteristics of a piezoelectric layer. Included are: a step of forming a seed titanium layer interposed therebetween, the seed titanium layer being formed at a desired film thickness by applying by titanium (Ti), at least twice; and a step of forming a piezoelectric precursor film by applying a piezoelectric material on the seed titanium layer, thereafter crystallizing the piezoelectric precursor film by baking, and thereby forming the piezoelectric layer.

6 Claims, 9 Drawing Sheets

METHOD OF MANUFACTURING A PIEZOELECTRIC ELEMENT AND A LIQUID INK JET HEAD

BACKGROUND OF THE INVENTION

1. Field of the Invention

The present invention relates to a piezoelectric element including a piezoelectric layer made of a piezoelectric material, a method of manufacturing the same, and a liquid jet head including the same.

2. Description of the Related Art

A piezoelectric element is an element which interposes, between two electrodes, a piezoelectric film made of a piezoelectric material having electrical-mechanical conversion functions. The piezoelectric film is constituted of a crystallized piezoelectric ceramic, for example.

In addition, as a liquid jet head for which such piezoelectric elements are used, for example, there has been an ink-jet recording head as follows. With regard to the ink-jet recording head, parts of each of pressure generating chambers, which communicate respectively with nozzle orifices from which ink droplets are to be ejected, are composed of a vibration plate. This vibration plate is caused to be deformed by piezoelectric elements, thus pressurizing ink in a corresponding pressure generating chamber. Thereby, ink droplets are ejected from the nozzle orifices. For the ink-jet recording head, there have been two types which are put in practical use: one using a piezoelectric actuator of longitudinal vibration mode, which extends and contracts in the axial direction of the piezoelectric element; and the other using a piezoelectric actuator of flexure vibration mode. For ink-jet recording heads using the actuator of flexure vibration mode, there has been an ink-jet recording head having piezoelectric elements which are to be formed in the following process: for example, an even piezoelectric film is formed in the entire surface of the vibration plate by a deposition technique. Thereafter, the piezoelectric layer is cut into pieces, each of which has a shape corresponding to each of the pressure generating chambers by use of a lithography technique. Thus, piezoelectric elements are formed in a way that the piezoelectric elements in the respective pressure generating chambers are independent of one another.

For this piezoelectric layer (piezoelectric thin film) for example, a ferroelectric such as lead-zirconate-titanate (PZT) is used. In addition, such a piezoelectric thin film is formed in the following process: for example, titanium crystals are deposited on a lower electrode by use of a sputtering method or the like. Thereafter, a piezoelectric precursor film is formed on the titanium crystals by use of a sol-gel method. Then, this piezoelectric precursor film is baked, and accordingly, the piezoelectric thin film is formed (see Japanese Patent Laid-open Official Gazette No. 2001-274472, for example).

If the piezoelectric layer were formed in such a manner, crystals of the piezoelectric layer could be grown with crystals of titanium serving as nuclei. Accordingly, columnar crystals with relatively high density could be obtained. However, it is difficult to control the crystallinity of the piezoelectric layer, and it is impossible to homogenize electrical and mechanical characteristics of the piezoelectric layer. This brings about a problem that displacement characteristics of the respective piezoelectric elements are uneven.

SUMMARY OF THE INVENTION

With the aforementioned matters taken into consideration, an object of the present invention is to provide a piezoelectric element which enables the characteristics of a piezoelectric layer to be improved and homogenized, a method of manufacturing the same, and a liquid jet head.

A first aspect of the present invention to solve the aforementioned problem is a piezoelectric element, which includes a lower electrode provided on one side of a substrate, a piezoelectric layer provided on the lower electrode, and an upper electrode provided on the piezoelectric layer. The piezoelectric element is characterized in that, on the lower electrode which is formed on the substrate, the piezoelectric layer is formed with a seed titanium layer interposed therebetween, the seed titanium layer being formed at a desired film thickness by applying titanium (Ti), at least twice.

According to the first aspect, the seed titanium layer is formed by performing the application process a plurality of times, in order that the seed titanium layer with which to form the piezoelectric layer may be deposited at a desired film thickness. For this reason, more seed titanium can be formed on the substrate in comparison with a case where the seed titanium layer is formed at a desired thickness by performing the application process only once. Since crystals of the piezoelectric layer grow on the basis of this titanium seed layer, the forming of more seed titanium could improve the crystallinity of the piezoelectric layer.

A second aspect of the present invention is a method of manufacturing a piezoelectric element, which includes a lower electrode provided on one side of a substrate, a piezoelectric layer provided on the lower electrode, and an upper electrode provided on the piezoelectric layer. The method of manufacturing piezoelectric elements is characterized by including: a step of forming a seed titanium layer by applying titanium (Ti), at least twice, on the lower electrode formed on the substrate; and a step of forming a piezoelectric precursor film by applying a piezoelectric material on the seed titanium layer, baking and crystallizing the piezoelectric precursor film, and forming the piezoelectric layer.

According to the second aspect, crystals of the piezoelectric layer grow from a large amount of seed titanium. Accordingly, the crystallinity of the piezoelectric layer is improved. In addition, characteristics of the piezoelectric layer are homogenized in the same substrate.

A third aspect of the present invention is the method of manufacturing the piezoelectric element according to the second aspect, which is characterized in that, in the step of forming the seed titanium layer, the seed titanium layer to be formed by performing the application process once is formed at a thickness of 0.2 nm to 0.8 nm.

According to the third aspect, the thickness of the seed titanium layer to be formed by performing the application process once is controlled. For this reason, the characteristics of the piezoelectric layer are more fully homogenized.

A fourth aspect of the present invention is the method of manufacturing the piezoelectric element according to any one of the second and the third aspects, which is characterized in that the seed titanium layer is formed at a thickness of 1 nm to 10 nm.

According to the fourth aspect, the seed titanium layer is formed at a predetermine thickness. For this reason, the characteristics of the piezoelectric layer are further more fully homogenized.

A fifth aspect of the present invention is the method of manufacturing the piezoelectric element according to any one of the second to the fourth aspects, which is characterized in that the film density of the seed titanium layer is not lower than 4.5 g/cm$^3$.

According to the fifth aspect, the film density of the seed titanium layer is caused to be not lower than a predetermined value. For this reason, the characteristics of the piezoelectric layer are still more homogenized.

A sixth aspect of the present invention is a method of manufacturing the piezoelectric element according to any one of the second to the fifth aspects, which is characterized in that the thickness of an oxide layer of the surface of the seed titanium layer is less than 2.0 nm.

According to the sixth aspect, the crystal growth of the piezoelectric layer is not impeded by the oxide layer which is a naturally oxidized film to be formed on the surface of the seed titanium layer. For this reason, the characteristics of the piezoelectric layer are improved, and homogenized, more reliably.

A seventh aspect of the present invention is the method of manufacturing the piezoelectric element according to any one of the second to the sixth aspects, which is characterized in that the seed titanium layer is non-crystalline.

According to the seventh aspect, the crystals of the piezoelectric layer grow in a favarable shape. For this reason, the crystallinity of the piezoelectric layer is more reliably improved.

An eighth aspect of the present invention is a liquid jet head which includes a piezoelectric element which has been manufactured by the manufacturing method according to any one of the second to the seventh aspects.

The eighth aspect can realize the liquid jet head, the displacement characteristic of the piezoelectric element of which has been homogenized.

DESCRIPTION OF THE EMBODIMENT

Detailed descriptions will be provided for the present invention herein below on the basis of an embodiment.

First Embodiment

Figure 1:
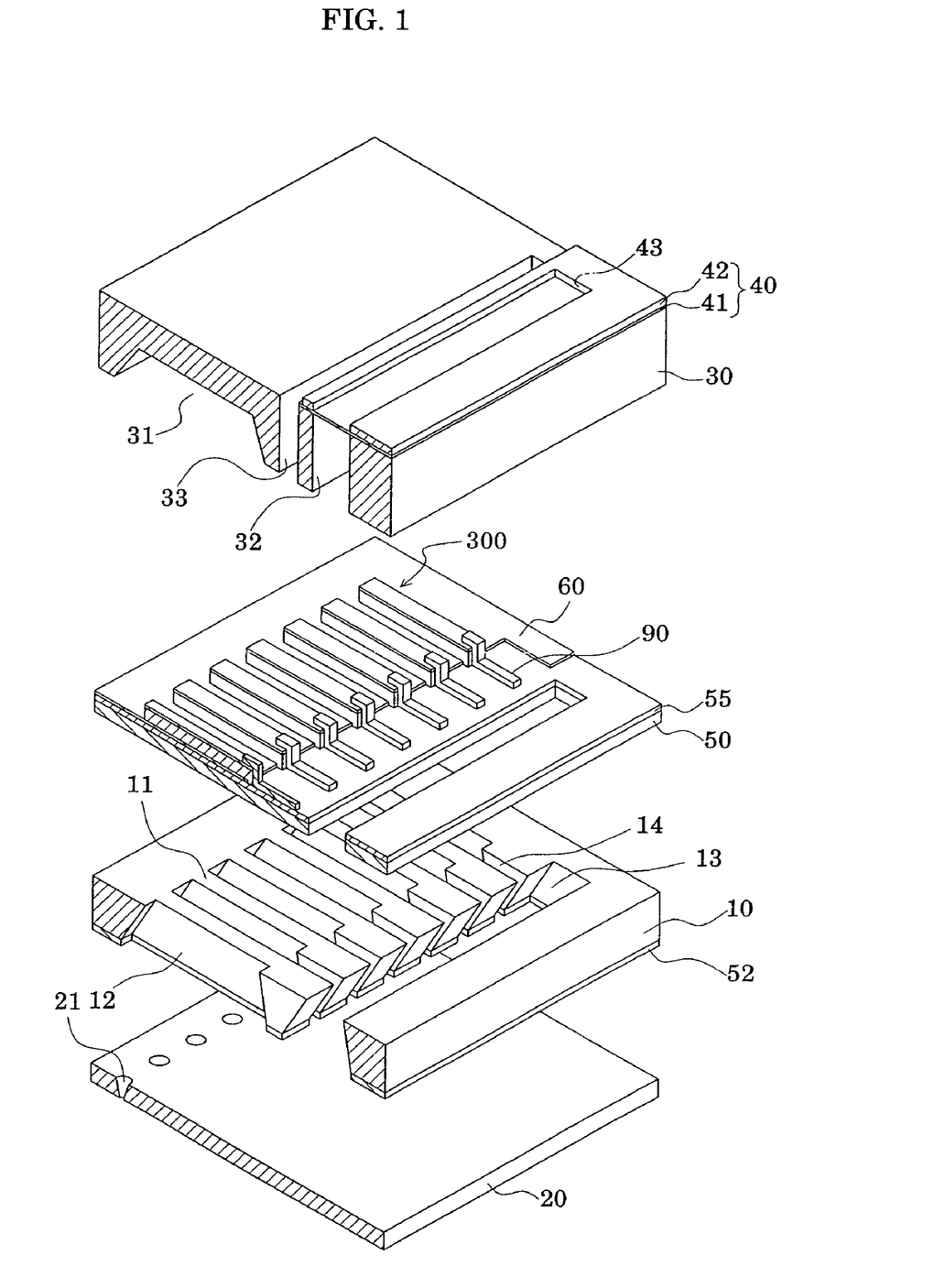
FIG. 1 is an exploded, perspective view showing a recording head according to a first embodiment.
Figure 2A:
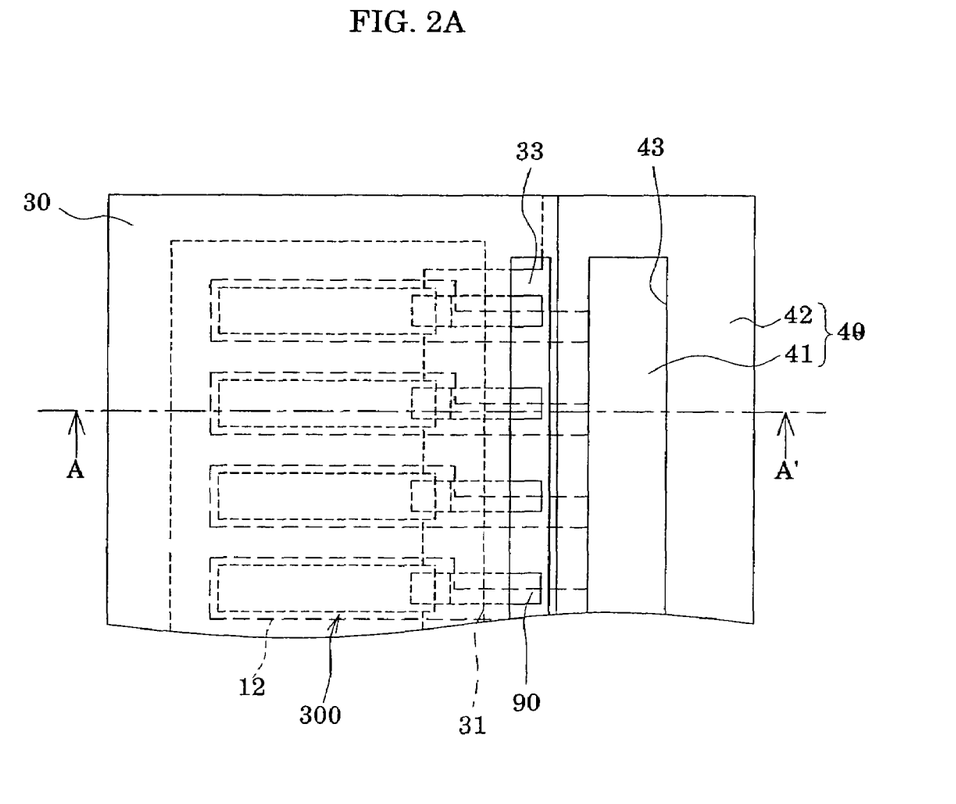
FIGS. 2(A) and 2(B) are respectively a plan view and a cross-sectional view, both of which show the recording head according to the first embodiment.
Figure 2B:
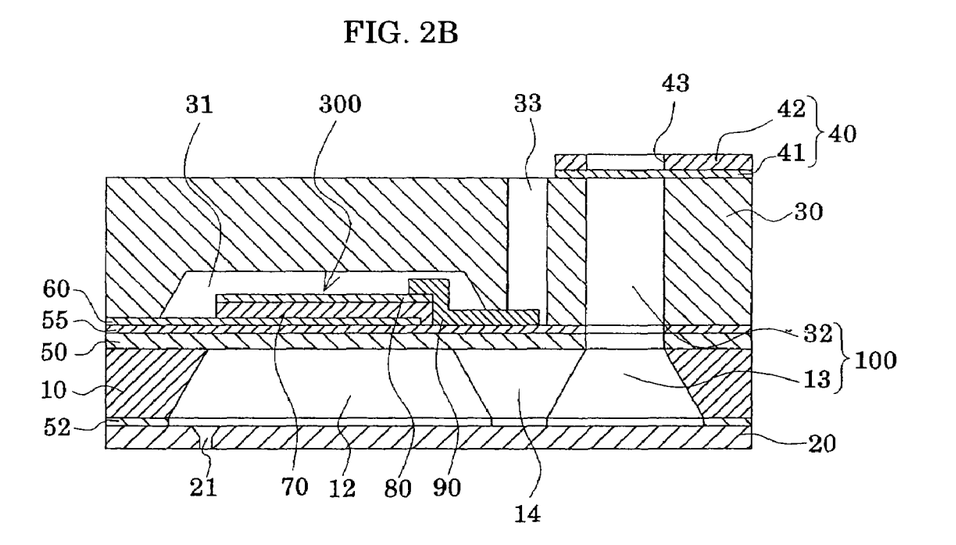

FIG. 1 is an exploded, perspective view showing an ink-jet recording head according to a first embodiment of the present invention. FIGS. 2(A) and 2(B) are respectively a plan view and a cross-sectional view, both of which show the recording head of FIG. 1. As illustrated, a passage-forming substrate 10 is made of a single crystal silicon substrate of the (110) plane orientation in the present embodiment. An elastic film 50 with a thickness of 0.5 μm to 2.0 μm made of silicon dioxide, which has been formed beforehand by thermal oxidation, is formed on one surface of the passage-forming substrate 10. In the passage-forming substrate 10, a plurality of pressure generating chambers 12 are arrayed in the width direction of the passage-forming substrate 10. In addition, a communicating portion 13 is formed in an area outside the pressure generating chambers 12 in the passage-forming substrate 10 in the longitudinal direction thereof. The communicating portion 13 and each of the pressure generating chambers 12 communicate with each other through each of ink supply paths 14 which are provided to the respective pressure generating chambers 12. Incidentally, the communicating portion 13 communicates with a reservoir portion of a protective plate, which will be described later, and constitutes parts of a reservoir which is an ink chamber commonly used by each of the pressure generating chambers 12. Each of the ink supply paths 14 is formed so as to have a width which is narrower than each of the pressure generating chambers 12. Accordingly, each of the ink supply paths 14 maintains a path resistance against ink to be constant, the ink flowing into each of the pressure generating chambers 12 from the communicating portion 13.

In addition, a nozzle plate 20 is fixed to an opening surface's side of the passage-forming substrate 10 with a masking film 52, which will be described later, interposed between the nozzle plate 20 and the passage-forming substrate 10, by use of an adhesive agent, a thermal adhesive film or the like; in the nozzle plate 20, nozzle orifices 21 which communicate respectively with the vicinities of the ends of the pressure generating chambers 12 on the sides opposite to the ink supply paths 14 are drilled. Incidentally, the nozzle plate 20 is fabricated of a glass ceramic, a single crystal silicon substrate, a stainless steel or the like, having a thickness, for example, of 0.01 mm to 1.00 mm and a coefficient of linear expansion, for example, of 2.5 to 4.5 [×10$^{-6}$/° C.] at a temperature equal to or below 300° C.

On the other hand, on the side opposite to the opening surface of such a passage-forming substrate 10, the elastic film 50 with a thickness, for example, of approximately 1.0 μm made of silicon dioxide (SiO$_2$) is formed, as described above. On the elastic film 50, an insulation film 55 with a thickness, for example, of approximately 0.4 μm made of zirconia (ZrO$_2$) is formed. Additionally, on the insulation film 55, a lower electrode film 60 having a thickness, for example, of 0.1 μm to 0.2 μm, a piezoelectric layer 70 having a thickness, for example, of approximately 1.0 μm, and an upper electrode film 80 having a thickness, for example, of approximately 0.05 μm are laminated by uses of a process, which will be described later to collectively constitute a piezoelectric element 300. At this point, the piezoelectric element 300 means a part which includes the lower electrode film 60, the piezoelectric layer 70 and the upper electrode film 80. In general, each of the piezoelectric elements 300 is configured by using any one of the two electrodes as a common electrode, and by patterning the other of the two electrodes and the piezoelectric layer 70 for each of the pressure-generating chambers 12. Here, a part, which has been formed of the patterned one of the two electrodes and the piezoelectric layer 70, and which causes piezoelectric strain due to an application of voltage to both of the two electrodes, is termed as a piezoelectric active portion. In the present embodiment, the lower electrode film 60 is an electrode commonly used by the piezoelectric elements 300, and each of the upper electrode films 80 is an individual electrode for each of the piezoelectric elements 300. However, even if these assignments are reversed on account of a drive circuit and wiring, there is no problem caused by this. In any case, the piezoelectric active portion is formed in each of the pressure-generating chambers. Here, the piezoelectric elements 300 and a vibration plate which provides displacement due to drive of the piezoelectric elements 300 are collectively termed as a piezoelectric actuator. Incidentally, in the present embodiment, the elastic film 50, the insulation film 55 and the lower electrode film 60 collectively play a role of the vibration plate. It goes without saying that only the elastic film and the insulation film may be configured to play a role of the vibration plate.

In addition, a lead electrode 90 made, for example, of gold (Au) or the like is connected with each of the upper electrode films 80 of the respective piezoelectric elements 300, and a voltage is designed to be applied selectively on each of the piezoelectric elements 300 through the respective lead electrodes 90.

A protective plate 30, which has a piezoelectric element holding portion 31 in an area facing the piezoelectric elements 300, is joined on the surface of the passage-forming substrate 10 on the side of the piezoelectric elements 300. Since the piezoelectric elements 300 are formed within the piezoelectric element holding portion 31, the piezoelectric elements 300 are protected in a state where the piezoelectric elements 300 are affected by almost no influence of the external environment. In addition, the protective plate 30 is provided with a reservoir portion 32 in an area corresponding to the communicating portion 13 of the passage-forming substrate 10. In the present embodiment, the reservoir portion 32 is provided, in the same direction that the pressure-generating chambers 12 are arranged, in a way that the reservoir portion 32 penetrates through the protective plate 30 in the thickness direction thereof. As described above, the reservoir portion 32 is caused to communicate with the communicating portion 13 of the passage-forming substrate 10, thus constituting a reservoir 100 which is an ink chamber commonly used by the pressure generating chambers 12.

Furthermore, a through-hole 33, which penetrates through the protective plate 30 in the thickness direction thereof, is provided in an area between the piezoelectric element holding portion 31 and the reservoir portion 32 of the protective plate 30. A part of the lower electrode film 60 and an extremity of each of the lead electrodes 90 are exposed to the inside of the through-hole 33. Although not illustrated, one end of connecting wiring, which extents from a drive IC, is connected with the lower electrode film 60 and the lead electrodes 90.

It should be noted that, as a material for the protective plate 30, for example, glass, a ceramic material, a metal, a resin and the like can be listed. However, it is preferable that the protective plate 30 be made of a material having approximately the same coefficient of thermal expansion as the material of the passage-forming substrate 10. In the present embodiment, a single crystal silicon substrate, the material of which is the same as the material of the passage-forming substrate 10, is used for the protective plate 30.

Moreover, a compliance plate 40 is joined on the protective plate 30; the compliance plate 40 is constituted of a sealing film 41 and a fixed plate 42. The sealing film 41 is fabricated of a flexible material with low rigidity (for example, a polyphenylene sulfide (PPS) film with a thickness of 6 μm). A surface in one direction of the reservoir portion 32 is sealed off by the sealing film 41. In addition, the fixed plate 42 is fabricated of a rigid material such as a metal (for example, stainless steel (SUS) with a thickness of 30 μm or the like). An area in this fixed plate 42 facing the reservoir 100 is an opening portion 43 which has been obtained by completely removing the corresponding part of the fixed plate 42 in the thickness direction thereof. For this reason, the surface in the aforementioned direction of the reservoir 100 is sealed off by only the sealing film 41, which is flexible.

The ink-jet recording head according to the embodiment as described above takes in ink from external ink supply means, which is not illustrated, and fills its interior, ranging from the reservoir 100 to the nozzle orifices 21, with ink. Thereafter, the ink-jet recording head applies a voltage between the lower electrode film 60 and a corresponding one of the upper electrode films 80, both of which correspond to each of the pressure generating chambers 12, thus causing the elastic film 50, the insulation film 55, the lower electrode film 60 and the piezoelectric layer 70 to provide displacement respectively. This increases the pressure within each of the pressure generating chambers 12, thus ejecting ink droplets from each of the corresponding nozzle offices 21.

Here, descriptions will be provided for a method of manufacturing such an ink-jet recording head with reference to FIGS. 3 to 6. Incidentally, FIGS. 3 to 6 are cross-sectional views showing the pressure generating chamber 12 in the longitudinal direction thereof. As shown in FIG. 3(a), first of all, a wafer 110 for a passage-forming substrate, which is a silicon wafer, is thermally oxidized in a diffusion furnace at a temperature of approximately 1,100° C., and thus a silicon dioxide film 51, which will constitute an elastic film 50, is formed on the surface of the wafer 110 for the passage-forming substrate. Incidentally, in the present embodiment, for the passage-forming substrate 10, a silicon wafer with high rigidity and with a relatively large thickness of approximately 625 μm is used.

Figure 3A:
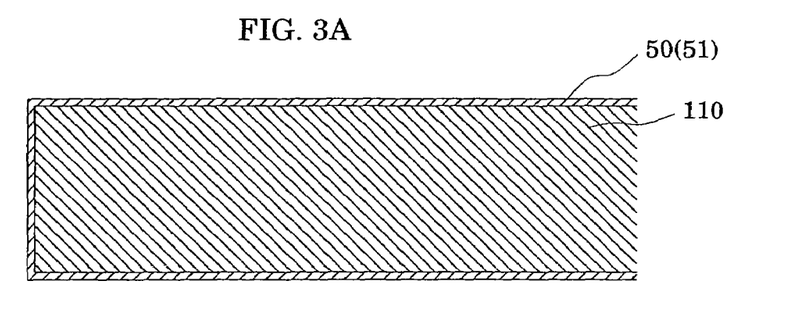
FIGS. 3(A) to 3(D) are cross-sectional views showing steps of manufacturing the recording head according to the first embodiment.
Figure 3B:
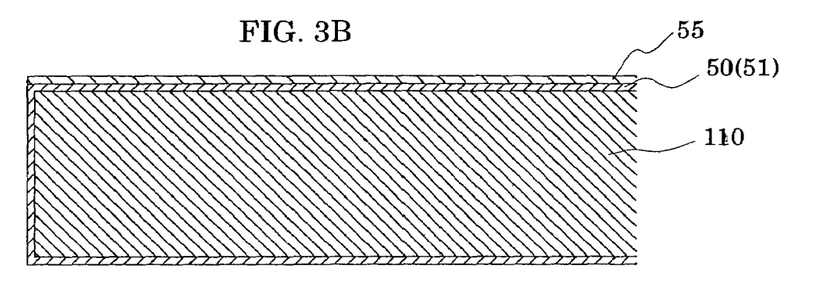
Figure 3C:
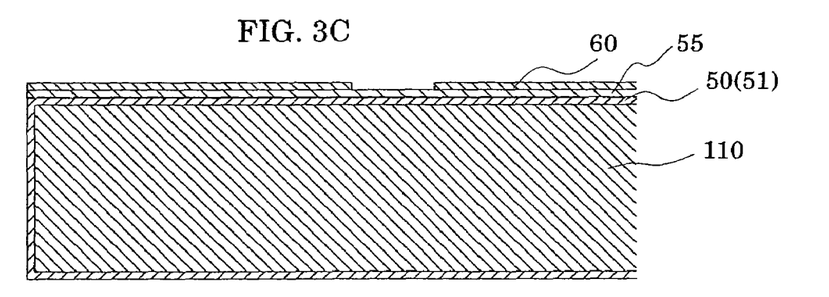

Subsequently, as shown in FIG. 3(b), on the elastic film 50 (silicon dioxide film 51), an insulation film 55 made of zirconia is formed. Specifically, on the elastic film 50 (silicon dioxide film 51), a zirconium (Zr) layer is formed, for example, by use of a sputtering method or the like. Thereafter, this zirconium layer is oxidized thermally in a diffusion furnace heated, for example, at a temperature of 500° C. to 1,200° C. Thereby, the insulation film 55 made of zirconia ($ZrO_2$) is formed. As shown in FIG. 3(c), subsequently, the lower electrode film 60 made, for example, of at least platinum and iridium, is formed on the entire surface of the insulation film 55. Thereafter, the lower electrode film 60 is patterned into a predetermined shape.

Figure 3D:
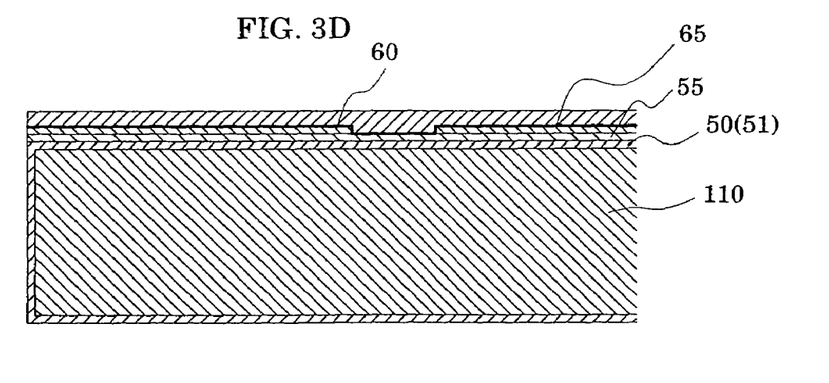

As shown in FIG. 3(d), then, titanium (Ti) is applied, for example twice or more, on the lower electrode film 60 and the insulation film 55 by a sputtering method. In the present embodiment, however, the application is performed twice. Thereby, a seed titanium layer 65 with a predetermined thickness is formed. In this way, the seed titanium layer 65 can be formed in a good shape. Concurrently, a large amount of seed titanium is also formed: the seed titanium serves as nuclei of the crystals of the piezoelectric layer 70, which will be formed in a step mentioned below. Consequently, the crystallinity of the piezoelectric layer 70 to be formed on the seed titanium layer 65 is improved to a large extent. Incidentally, it is preferable that the thickness of the seed titanium layer to be formed each time the application process is performed be approximately 0.2 nm to 0.8 nm. Additionally, it is preferable that the thickness of the seed titanium layer 65 to be finally formed after a series of the application processes be approximately 1 nm to 10 nm.

In the present embodiment, for example, titanium is applied with a thickness of 0.5 nm twice under the following sputtering conditions: 0.8 (Pa) for the sputtering pressure, 100 (W) for the sputtering output, and a room temperature (RT) for the sputtering temperature. Thereby, the seed titanium layer 65 with a thickness of approximately 1.0 nm is formed.

At this point, the surface of the seed titanium layer 65 thus formed is naturally oxidized to a certain depth with the lapse of time. Accordingly, an oxidized layer (not illustrated) is formed on the surface of the seed titanium layer 65. In addition, if such an oxidized layer were formed with a relatively large thickness on the surface of the seed titanium layer 65, the crystal growth of the piezoelectric layer 70, which will be formed in the below-mentioned step, may be impeded. For this reason, the thick formation of the naturally oxidized layer is not preferable. With this taken into consideration, it is preferable that the thickness of the oxidized layer (depth of oxidation) on the surface of the seed titanium layer 65 be as thin as possible when the piezoelectric layer is going to be formed. It is desirable that the thickness be less than 2.0 nm at maximum.

Furthermore, it is preferable that the seed titanium layer 65 thus formed be as high in film density (Ti density) as possible. It is desirable that the film density be no less than 4.5 g/cm$^3$ at minimum. That is because, the larger the film density of the seed titanium layer 65 is, the smaller the thickness of the aforementioned oxidized layer is held to be. Accordingly, the crystals of the piezoelectric layer 70 are grown in a favorable shape. Incidentally, the film density of the seed titanium layer 65 is determined by the deposition conditions, irrespective of the thickness of the seed titanium layer 65. Moreover, it is preferable that the seed titanium layer 65 be non-crystalline. Specifically, it is preferable that the X-ray diffraction intensity of the (002) plane of the seed titanium layer 65 be substantially zero. If the seed titanium layer 65 were non-crystalline in this manner, the film density of the seed titanium layer 65 would become larger, and the thickness of the oxidized layer to be formed on the surface of the seed titanium layer 65 would accordingly be held to be smaller. As a result, the crystals of the piezoelectric layer 70 could be grown in a better shape.

Herein, Table 1, which will be listed below, shows a result of performing a study in the following manner: seed titanium layers were formed by use of the three respective methods representing a first embodied example as well as a first and a second comparative example, all of which methods will be described later. Deposition conditions were different from one method to another. With regard to oxidized layers (TiO$_2$) which were formed on the respective seed titanium layers by use of the respective methods, their thicknesses, film densities and degrees of orientation of the (002) plane were examined. Incidentally, it is preferable that the thickness of the seed titanium layer be approximately 1 nm to 10 nm, as described above. However, for the convenience of measuring the film densities and the like, the thicknesses of the respective seed titanium layers to be formed for the embodied example and the two comparative examples were caused to be 20 nm.

A FIRST EMBODIED EXAMPLE

Titanium was applied with a thickness of 0.5 nm four times under the following sputtering conditions: 0.8 (Pa) for the sputtering pressure, 100 (W) for the sputtering output, a room temperature (RT) for the sputtering temperature. Accordingly, a seed titanium layer with a thickness of approximately 2.0 nm was formed.

A FIRST COMPARATIVE EXAMPLE

A seed titanium layer of a first comparative example was formed under the same conditions as the seed titanium layer of the first comparative example was formed, except that titanium was applied with a thickness of 20 nm once.

A SECOND COMPARATIVE EXAMPLE

A seed titanium layer of a second comparative example was formed under the same conditions as the seed titanium layer of the first embodied example was formed, except that the sputtering pressure of the second comparative example was caused to be 3.0 (Pa)

TABLE 1

| | EMBODIED EXAMPLE 1 | COMPARATIVE EXAMPLE 1 | COMPARATIVE EXAMPLE 2 |
|---|---|---|---|
| THICKNESS OF OXIDIZED LAYER (DEPTH OF OXIDATION) | 1.247 | 3.1 | 2.9 |
| FILM DENSITY (g/cm$^3$) | 4.608 | 4.423 | 3.129 |
| XRD INTENSITY OF (002) PLANE (cps) | 0 | 70 | 0 |

As shown in the above table 1, with regard to the seed titanium layers of the first and the second comparative examples, both of which had been formed by applying titanium once, the thicknesses of the respective oxidized layers, which had been formed respectively on the surfaces of the seed titanium layers, were relatively large, or approximately 3 nm. Accordingly, it was confirmed that their formation states were not good. In addition, with regard to the seed titanium layer of the first comparative example, the XRD intensity (X-ray diffraction intensity) of the (002) plane was 70 (pcs). In other words, the seed titanium layer of the first comparative example was in a crystalline state. Its film density took up a relatively small value, which was smaller than 4.5 (g/cm$_3$). On the other hand, the seed titanium layer of the second comparative example, which had been formed under the relatively high sputtering pressure, was non-crystalline. However, its film density took up a smaller value than the film density of the seed titanium layer of the first comparative example did. In sum, the film densities respectively of the seed titanium layers of the first and the second comparative examples, both of which had been formed by applying titanium only once, took up relatively small values respectively.

On the contrary, with regard to the seed titanium layer of the first embodied example, which had been formed by applying titanium a plurality of times, the thickness of the oxidized layer which had been formed on the surface was smaller than 2.0 nm: Specifically, the thickness was held to be extremely small, or approximately 1.2 nm. Its formation state was extremely good. In addition, with regard to the seed titanium layer of the first embodied example, the XRD intensity (X-ray diffraction intensity) of the (002) plane was zero. In other words, the seed titanium layer of the first embodied example was non-crystalline. Its film density was extremely high, or equal to or higher than 4.5 (g/cm$^3$). Incidentally, it is conceivable that, if the seed titanium layer were formed with a thickness of approximately 1 nm to 10 nm, the formation state of the seed titanium layer could be far better.

Furthermore, if the piezoelectric layer 70 made, for example, of lead-zirconate-titanate were formed on the seed titanium layer 65 which has been deposited in a good shape as described above, the crystallinity of the piezoelectric layer 70 would be improved and homogenized. In the present embodiment, for example, the piezoelectric layer 70 was formed by use of a sol-gel method: according to the sol-gel method, a metallic organic compound was dissolved, and dispersed, into a solvent, and thereby what is called a sol was obtained; thereafter, the sol was made into a gel by applying the sol on the seed titanium layer 65 and drying the sol; and the gel thus obtained was baked at a high temperature, and accordingly the piezoelectric layer 70 made of the metallic oxide was obtained.

Figure 4A:
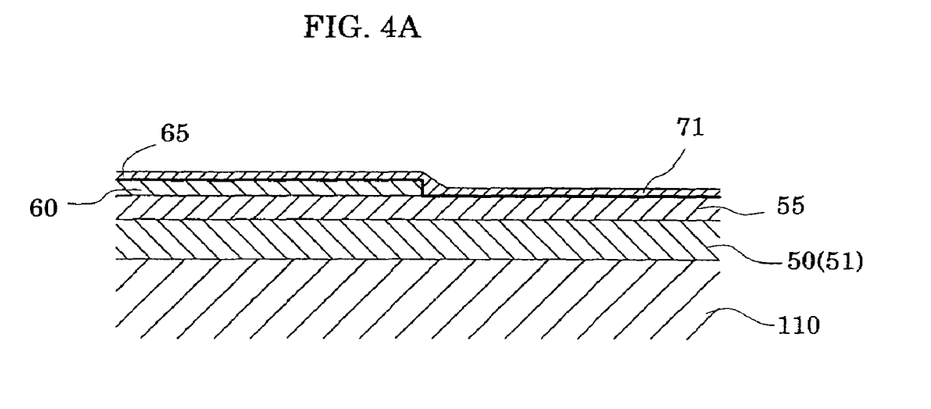
FIGS. 4(A) to 4(C) are cross-sectional views showing steps of manufacturing the recording head according to the first embodiment.

With regard to a procedure of forming the piezoelectric layer 70, as shown in FIG. 4(a), first of all, a piezoelectric precursor film 71 which is a PZT precursor film is deposited on the seed titanium layer 65. In other words, a sol (solution) including a metallic organic compound is applied on the wafer 110 for the passage-forming substrate. Subsequently, the piezoelectric precursor film 71 is heated at a predetermined temperature, and is dried for a predetermined length of time. Thereby, the solvent of the sol is evaporated, and thus the piezoelectric precursor film 71 is dried. In addition, the piezoelectric precursor film 71 is placed in the atmosphere, and is degreased at a predetermined temperature for a predetermined length of time. Incidentally, the "degrease," which has just been mentioned here, means to remove organic elements, which are included in the sol film, such as $NO_2$, $CO_2$, $H_2O$ and the like.

Figure 4B:
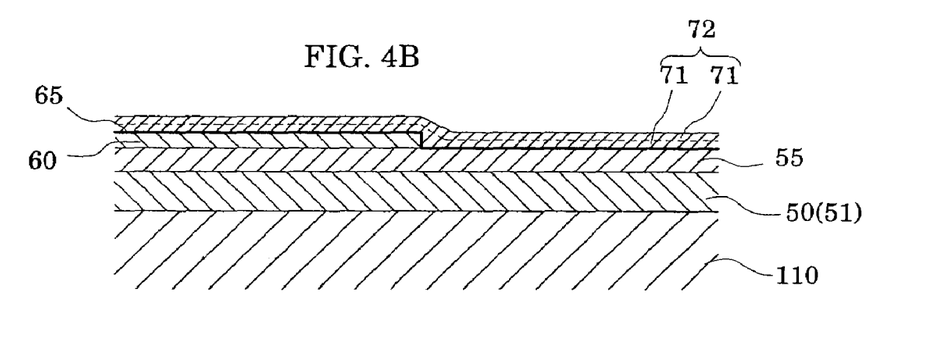
Figure 4C:
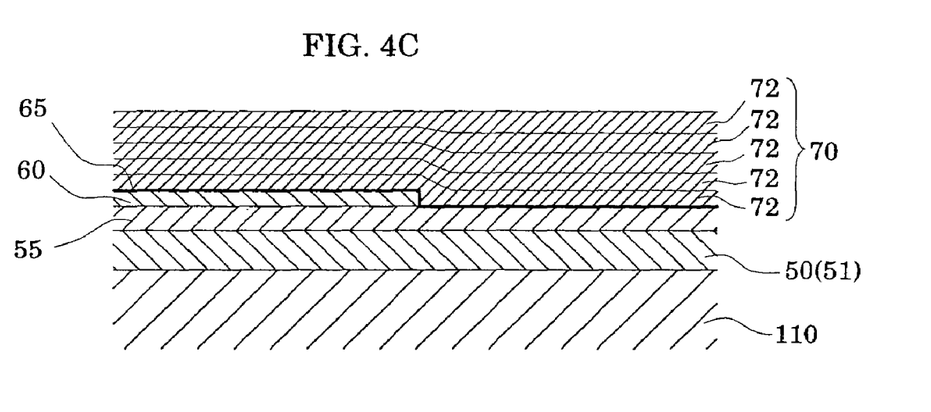

Then, the application process, the drying process and the degreasing process, which have been described above, are repeated for a predetermined number of times, for example, twice in the present embodiment. Thereby, the piezoelectric precursor film 71 is formed at a predetermined thickness as shown in FIG. 4(b). Thereafter, the piezoelectric precursor film 71 is processed thermally in a diffusion furnace, and thus is crystallized. Accordingly, the piezoelectric film 72 is formed. In other words, by baking the piezoelectric precursor film 71, crystals are grown with the seed titanium layer 65 serving as nuclei, and accordingly the piezoelectric film 72 is formed. In the present embodiment, for example, the piezoelectric precursor film 71 is baked by heating it at a temperature of approximately 700° for 30 minutes, and thereby the piezoelectric film 72 is formed. Incidentally, the crystals of the piezoelectric film 72 thus formed are orientated in the (100) plane with priority.

Furthermore, the application process, the drying process, the degreasing process, and the baking process, which have been described above, are repeated for a plurality of times. Thereby, the piezoelectric layer 70, with a predetermined thickness, made of a plurality of the piezoelectric films 72 is formed. In the present embodiment, the number of the piezoelectric films 72 is 5. If a film thickness of the piezoelectric precursor film 71 to be formed by applying the sol once were approximately 0.1 μm, for example, the entire film thickness of the piezoelectric layer 70 would be approximately 1 μm.

If the piezoelectric layer 70 were formed on the seed titanium layer 65 which has been formed in a favorable shape by applying titanium twice or more in the aforementioned manner, the crystallinity of the piezoelectric layer 70 would be improved to a large extent. In particular, the crystals of the piezoelectric layer 70 would grow from a large amount of seed titanium. Accordingly, the crystals of the piezoelectric layer 70 would be formed in a relatively dense manner, thus improving the crystallinity thereof to a large extent. In addition, unevenness in the characteristics of the piezoelectric layer 70 in a substrate 110 would be inhibited, thereby enabling displacement characteristics of each of the piezoelectric elements to be homogenized.

It should be noted that, as a material for the piezoelectric layer 70, for example, relaxor ferroelectrics may be used; the relaxor ferroelectrics are obtained by adding metals such as niobium, nickel, magnesium, bismuth, yttrium to a ferroelectric-piezoelectric material such as lead-zirconate-titanate (PZT). Its composition may be selected depending on necessity with the characteristics of, and the application of, the piezoelectric elements taken into consideration. For example, the following may be listed: $PbTiO_3$ (PT), $PbZrO_3$ (PZ), $Pb(Zr_xTi_{1-x})O_3$ (PZT), $Pb(Mg_{1/3}Nb_{2/3})O_3$—$PbTiO_3$ (PMN-PT), $Pb(Zn_{1/3}Nb_{2/3})O_3$—$PbTiO_3$ (PZN-PT), $Pb(Ni_{1/3}Nb_{2/3})O_3$—$PbTiO_3$ (PNN-PT), $Pb(In_{1/2}Nb_{1/2})O_3$—$PbTiO_3$ (PIN-PT), $Pb(Sc_{1/3}Ta_{2/3})O_3$—$PbTiO_3$ (PST-PT), $Pb(Sc_{1/3}Nb_{2/3})O_3$—$PbTiO_3$ (PSN-PT), $BiScO_3$—$PbTiO_3$ (BS-PT), $BiYbO_3$—$PbTiO_3$ (BY-PT) and the like. In addition, the method of manufacturing a piezoelectric layer 70 is not limited to the sol-gel method. For example, a MOD (Metal-Organic Decomposition) method and the like may be used.

Herein, descriptions will be provided for the results of performing a study in the following manner: seed titanium layers and piezoelectric layers were formed by use of the three respective methods representing a second embodied example as well as a third and a fourth comparative example, all of which methods will be described later. Accordingly, the crystallinities of piezoelectric layers respectively of the second embodied example and the two comparative examples were examined.

SECOND EMBODIED EXAMPLE

An elastic film, an insulation film and a lower electrode film were formed on a wafer for a passage-forming substrate in the aforementioned procedure. Thereafter, titanium (Ti) was applied with a thickness of approximately 0.5 nm on the lower electrode film by a sputtering method twice, and thus a seed titanium layer with a thickness of approximately 1.0 nm was formed. Sequentially, a piezoelectric layer was formed on the seed titanium layer by use of a sol-gel method as described above. Incidentally, the sputtering pressure was 0.8 Pa while the seed titanium layer was being formed.

THIRD COMPARATIVE EXAMPLE

A piezoelectric layer was formed by the same method as the piezoelectric layer of the second embodied example was formed, except that the seed titanium layer of the third comparative example was formed by applying titanium with a thickness of approximately 1.0 nm once.

FOURTH COMPARATIVE EXAMPLE

A piezoelectric layer was formed in the same manner as the piezoelectric layer of the second embodied example was formed, except that the seed titanium layer of the fourth comparative example was formed by applying titanium with a thickness of approximately 0.5 nm once.

AN EXPERIMENTAL EXAMPLE

Figure 7:
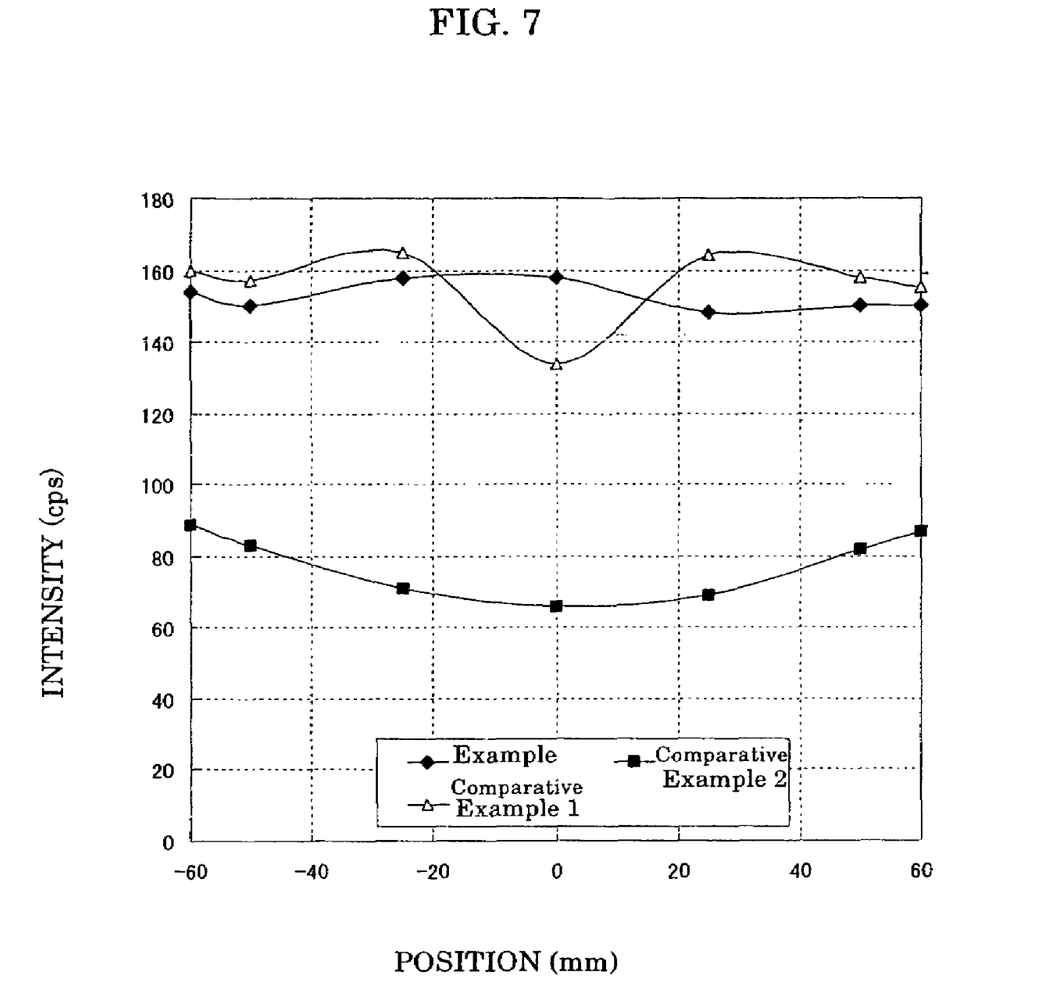
FIG. 7 is a graph showing distributions of peak intensities respectively of piezoelectric layers.

X-ray diffractions of the respective piezoelectric layers of the second embodied example as well as the third and the fourth comparative examples were measured by a wide-angle method. Thereby, the distribution (unevenness) of the diffraction intensity of each example was examined. Specifically, for each of the examples, X-ray diffractions of its piezoelectric layer were measured respectively at the following four points: 0 mm, 25 mm, 50 mm and 60 mm away from a reference position in the diameter direction with the center of the wafer for a passage-forming substrate defined as the reference position. FIG. 7 shows the distribution of the diffraction intensities (peak intensities) corresponding to the (100) plane of this occasion respectively for the second embodied example as well as the third and the fourth examples. Incidentally, these measured points were almost on a line for each of the examples.

As shown in FIG. 7, the peak intensities of the third comparative example were approximately 90 (cps) at maximum. The difference in peak intensity between the center and each of the two peripheries of the wafer for a passage-forming substrate, that is, the unevenness of peak intensities within the wafer were approximately 20 (cps) at maximum. By contrast, the peak intensities of the second embodied example were approximately 160 (cps) at maximum, or approximately twice as large as those of the third comparative example. In this manner, the peak intensities of the second embodied example were improved to a large extent. The unevenness of peak intensities within the wafer of the second embodied example was approximately 10 (cps) at maximum, or held to be small. On the other hand, the peak intensities of the fourth comparative example were at the same level as those of the second embodied example, but its unevenness of the peak intensities within the wafer was 30 (cps) at maximum, or larger than that of the embodied example.

As clearly understood from the results of the study, if the piezoelectric layer 70 were formed on the seed titanium layer 65 which has been formed with a predetermined thickness by applying titanium twice, the peak intensity of the piezoelectric layer 70 would be improved. In addition, the evenness of peak intensities of the piezoelectric layer 70 within the wafer would be also improved. In other words, the characteristics of the piezoelectric layer 70 would be improved, and the unevenness of the characteristics of the piezoelectric layer 70 could be held to be extremely small.

Figure 8:
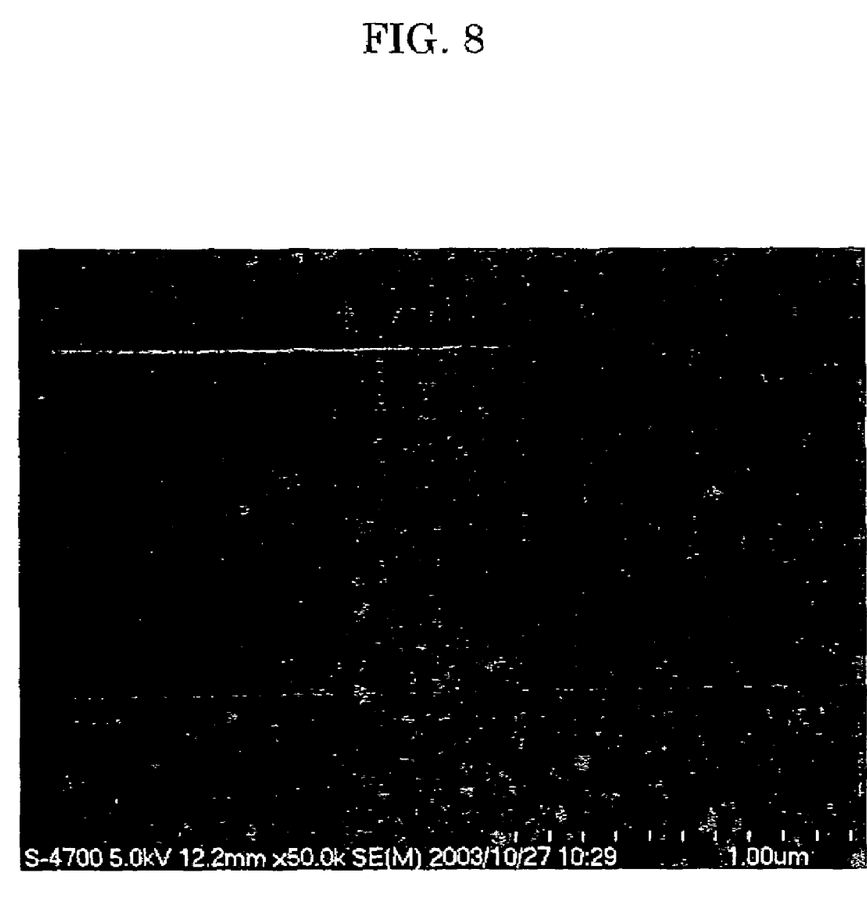
FIG. 8 is an SEM image showing a surface of a piezoelectric layer according to an embodied example.
Figure 9:
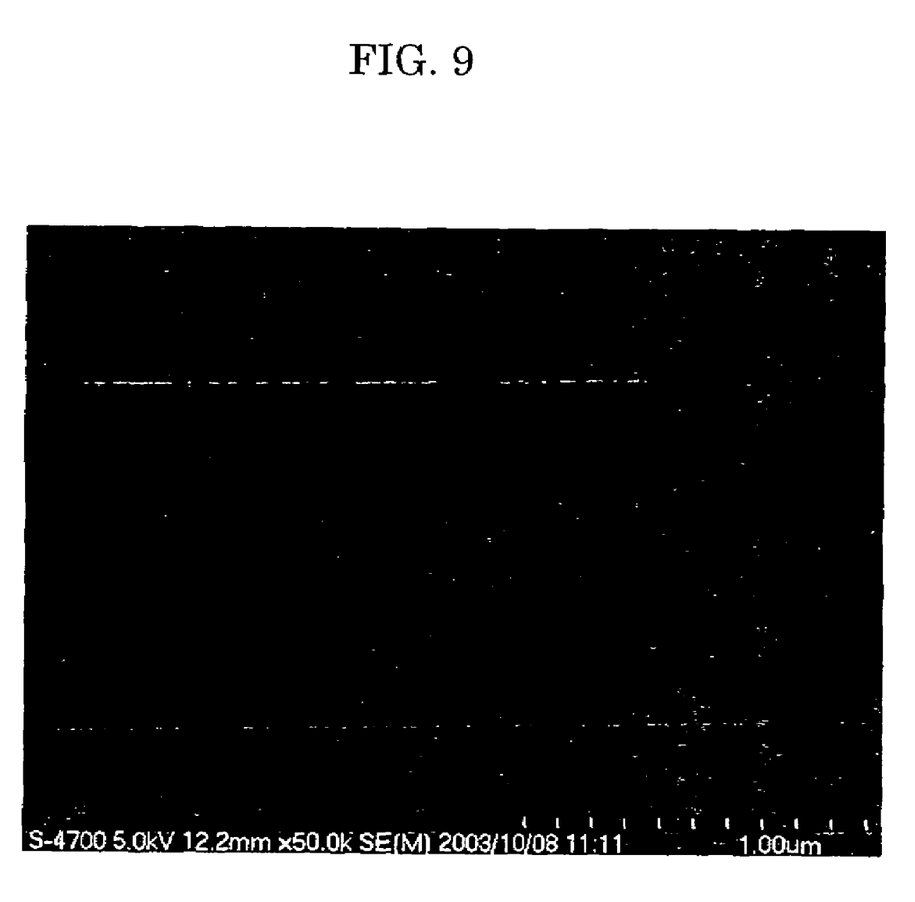
FIG. 9 is an SEM image showing a surface of a piezoelectric layer according to a comparative example.

Here, as shown in FIG. 8, for example, an average of particle diameters of the respective crystals in the piezoelectric layer of the second embodied example was relatively small, or approximately 100 nm. The particle diameters of the respective crystals were almost uniform. On the contrary, as shown in FIG. 9, an average of particle diameters of the respective crystals in the piezoelectric layer of the third comparative example was apparently larger than that of the embodied example. In addition, unevenness of the particle diameters of the respective crystals was also large. As understood from these SEM images, according to the present invention, the crystallinity of the piezoelectric layer 70 could be improved to a large extent. In other words, if the piezoelectric layer 70 were formed on the seed titanium layer 65 which has been formed by applying titanium twice or more, the crystals of the piezoelectric layer 70 would grow from a large amount of seed titanium. Accordingly, the piezoelectric layer 70 would be formed in a dense manner with crystals having relatively small particle diameters. Consequently, the characteristics of the piezoelectric layer 70 would be improved, and the unevenness of the characteristics would be held to be extremely small.

Figure 5A:
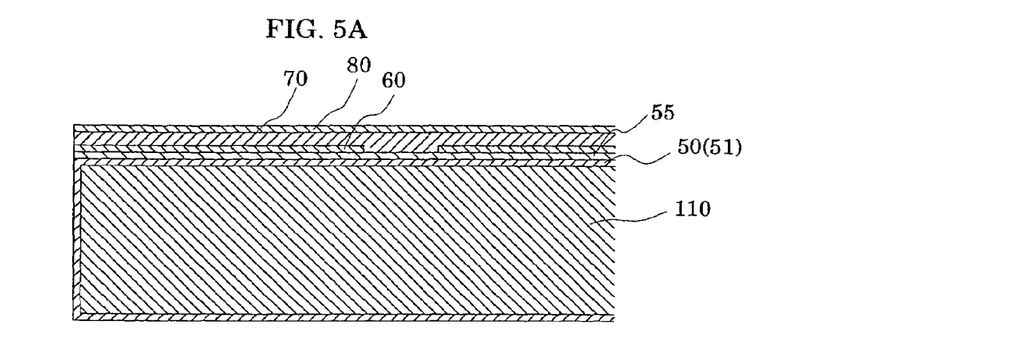
FIGS. 5(A) to 5(D) are cross-sectional views showing steps of manufacturing the recording head according to the first embodiment.
Figure 5B:
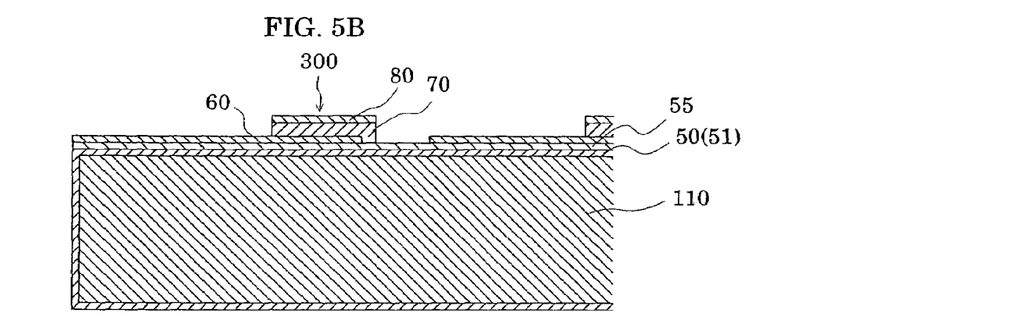
Figure 5C:
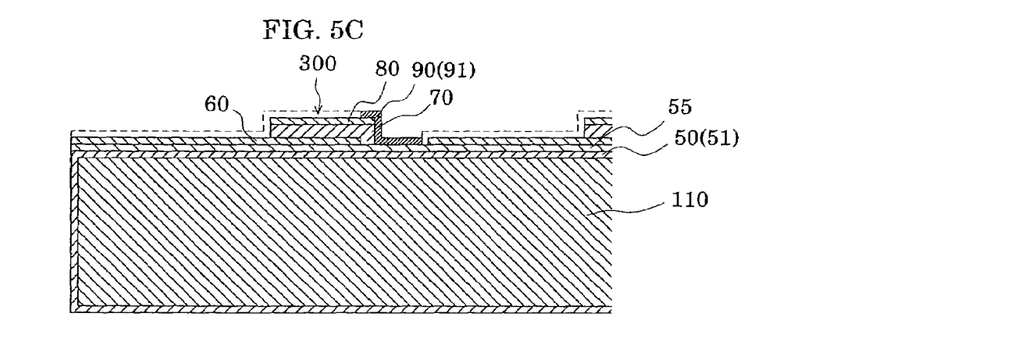

In addition, after the piezoelectric layer 70 is formed in the aforementioned manner, the upper electrode film 80, for example, of iridium is formed in the entire surface of the wafer 110 for the passage-forming substrate as shown in FIG. 5(a). Subsequently, as shown in FIG. 5(b), the piezoelectric layer 70 and the upper electrode film 80 are patterned in an area facing each of the pressure generating chambers 12, and thereby the piezoelectric elements 300 are formed. Then, the lead electrodes 90 are formed. Specifically, as shown in FIG. 5(c), a metallic layer 91 made, for example, of gold (Au) or the like is formed on the entire surface of the wafer 110 for the passage-forming substrate. After that, the metallic layer 91 is patterned for each of the piezoelectric elements 300 through a mask pattern (not illustrated) made, for example, of resist or the like, and thus the lead electrodes 90 are formed.

Figure 5D:
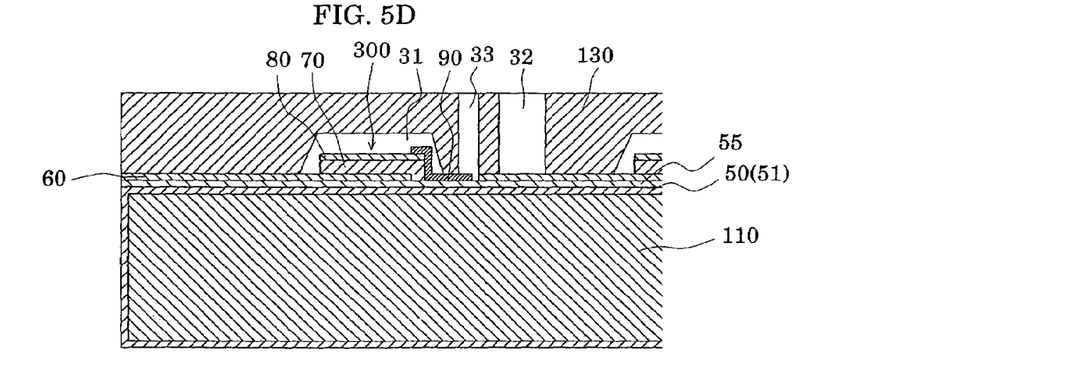

Subsequently, as shown in FIG. 5(d), the wafer 130 for the protective plate, which is a silicon wafer, and which becomes a plurality of protective plates 30, is joined to the wafer 110 for the passage-forming substrates on the side of the piezoelectric elements 300. Incidentally, the wafer 130 for the protective plate has a thickness, for example, of 400 μm. For this reason, by joining the wafer 130 for the protective plate to the wafer 110 for the passage-forming substrate, the rigidity of the latter wafer 110 is improved to a large extent.

Figure 6A:
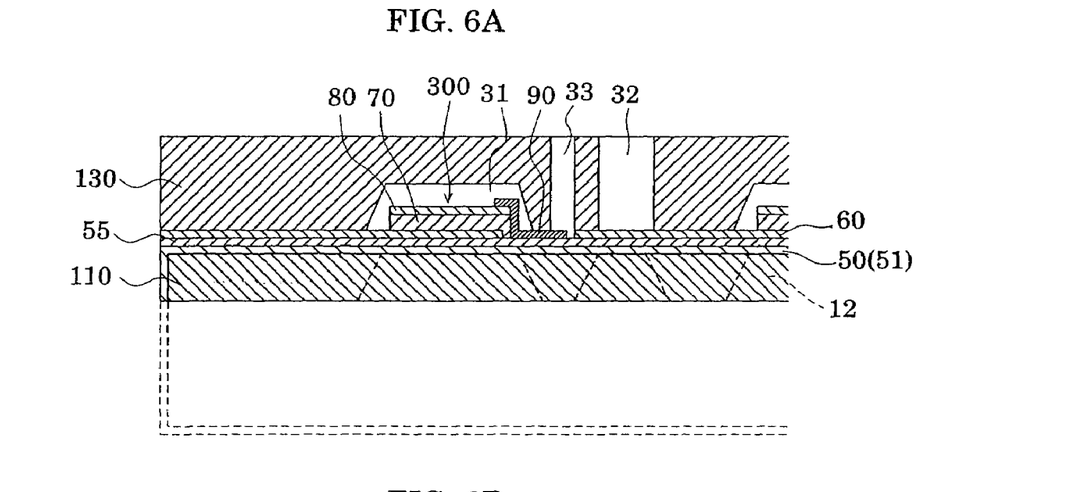
FIGS. 6(A) to 6(C) are cross-sectional views showing steps of manufacturing the recording head according to the first embodiment.
Figure 6B:
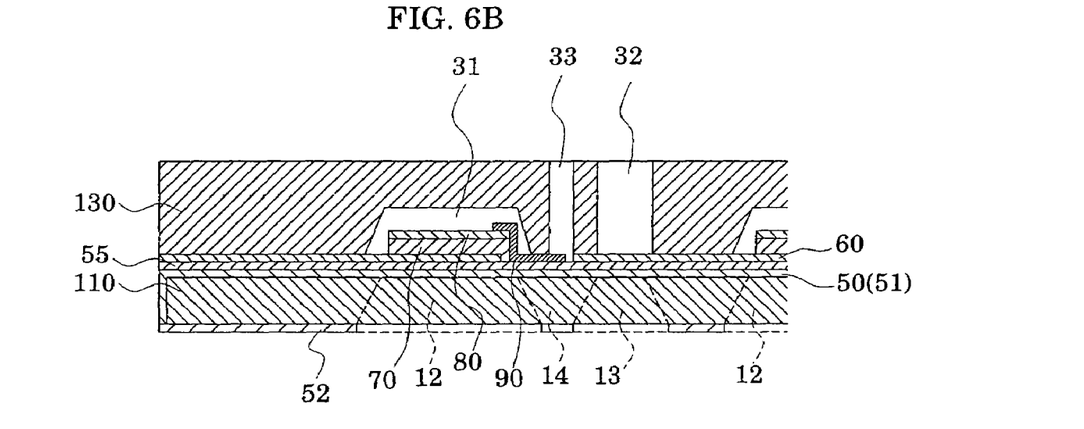
Figure 6C:
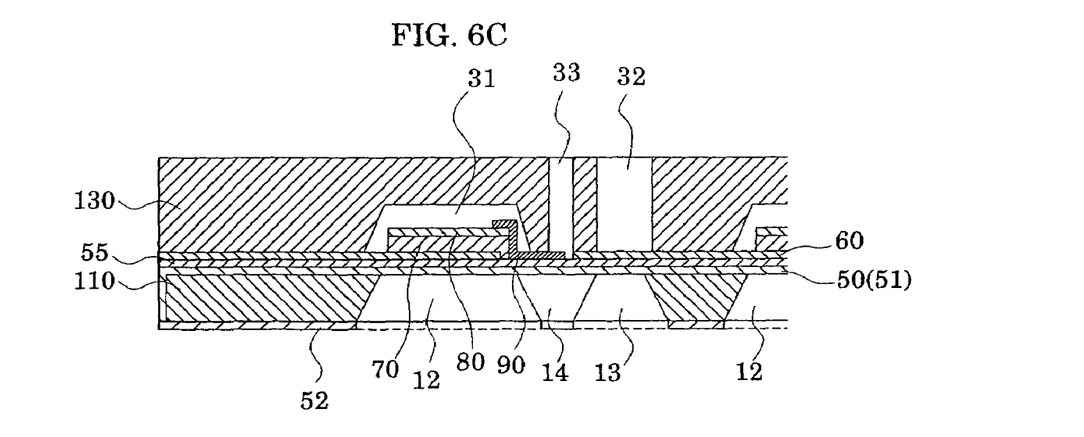

Then, as shown in FIG. 6(a), the wafer 110 for the passage-forming substrate is polished to a certain thickness. Thereafter, a wet etching process is performed on the wafer 110 for the passage-forming substrate by use of fluoro-nitric acid. Thereby, the wafer 110 for the passage-forming substrate is caused to have a predetermined thickness. In the present embodiment, the etching process is performed on the wafer 110 for the passage-forming substrate to a thickness, for example, of approximately 70 μm. Thence, as shown in FIG. 6(b), a masking film 52 made, for example, of silicon nitride (SiN) is newly formed on the wafer 110 for the passage-forming substrate, and is patterned into a predetermined shape. Then, the wafer 110 for the passage-forming substrate is etched anisotropically through the masking film 52. Thereby, as shown in FIG. 6(c), the pressure generating chambers 12, the communicating portion 13, the ink supply paths 14 and the like are formed in the wafer 110 for the passage-forming substrate.

It should be noted that, thereafter, unnecessary parts in the outer peripheral portions respectively of the wafer 110 for the passage-forming substrate and the wafer 130 for the protective plate are cut off by such means as dicing, and thus the unnecessary parts are removed. Then, the nozzle plate 20 in which the nozzle orifices 21 have been drilled is joined to the surface of the wafer 110 for the passage-forming substrate, the surface being a surface which does not face the wafer 130 for the protective plate. In addition, the compliance plate 40 is joined to the wafer 130 for the protective plate. Then, the wafer 110 for the passage-forming substrate and the like are divided into the passage-forming substrates 10 and the like with the size of a chip shown in FIG. 1. Thereby, the ink-jet recording head according to the present embodiment is formed.

As described above, in the present invention, the seed titanium layer 65 is formed by applying titanium on the lower electrode film 60 twice or more, and the piezoelectric layer 70 is formed on the seed titanium layer 65. This increases the number of crystal particles of the piezoelectric layer 70, and this forms the crystals in a dense manner. Accordingly, the crystallinity of the piezoelectric layer 70 is improved to a large extent. For this reason, the piezoelectric layer 70 with good electrical and mechanical characteristics can be formed. In addition, the unevenness of the characteristics of the piezoelectric layer 70 within the wafer can be held to be extremely small. Consequently, the piezoelectric elements 300 having good displacement characteristics can be formed, and the evenness of the displacement characteristics of each of the piezoelectric elements 300 can be improved to a large extent.

Other Embodiments

Descriptions have been provided for the embodiment of the present invention. However, the present invention is not limited to the aforementioned embodiment. Furthermore, in the aforementioned embodiment, the ink-jet recording head has been presented as an example of the liquid jet head. However, the present invention is broadly applicable to liquid jet heads as a whole. It goes without saying that the present invention can be applied to a liquid jet head which ejects a liquid other than ink. As other liquid jet heads, the following can be listed: for example, various recording heads to be used for image recording apparatuses such as a printer; a color material jet head to be used for manufacturing color filters of a liquid crystal display and the like; an electrode material jet head to be used for forming electrodes of an organic EL display, a field emission display (FED) and the like; a bio-organic matter jet head to be used for manufacturing biochips; and the like. Furthermore, it is a matter of course that use of the method of manufacturing piezoelectric elements according to the present invention is not limited to the liquid jet head. It goes without saying that the method of manufacturing piezoelectric elements according to the present invention can be applied to piezoelectric elements to be mounted on all other devices, for example, microphones, sounding bodies, various kinds of oscillators, radiators and the like, and that the method of manufacturing piezoelectric elements can be also applied to a method of manufacturing those piezoelectric elements.

What is claimed is:

1. A method of manufacturing a piezoelectric element, which includes a lower electrode provided on one side of a substrate, a piezoelectric layer provided on the lower electrode, and an upper electrode provided on the piezoelectric layer, the method comprising:
    forming a seed titanium layer by applying titanium (Ti) at least twice consecutively, on the lower electrode formed on the substrate; and
    forming a piezoelectric precursor film by applying a piezoelectric material on the seed titanium layer, baking and crystallizing the piezoelectric precursor film, and forming the piezoelectric layer.

2. The method of manufacturing the piezoelectric element according to claim 1,
    wherein, in the step of forming the seed titanium layer, a thickness of the seed titanium layer to be formed by performing the application process once of a plural number of times is 0.2 nm to 0.8 nm.

3. The method of manufacturing the piezoelectric element according to claim 1,
    wherein the seed titanium layer is formed at a thickness of 1 nm to 10 nm.

4. The method of manufacturing the piezoelectric element according to claim 1,
    wherein a film density of the seed titanium layer is not lower than 4.5 g/cm$^3$.

5. The method of manufacturing the piezoelectric element according to claim 1,
    wherein a thickness of an oxide layer of a surface of the seed titanium layer is less than 2.0 nm.

6. The method of manufacturing the piezoelectric element according to claim 1,
    wherein the seed titanium layer is non-crystalline.

* * * * *